United States Patent
Kim et al.

(10) Patent No.: US 12,426,491 B2
(45) Date of Patent: Sep. 23, 2025

(54) GIP LAYOUT FOR FOLDING DISPLAY

(71) Applicant: LG DISPLAY CO., LTD., Seoul (KR)

(72) Inventors: Dong-Yul Kim, Paju-si (KR); Tae-Joon Ahn, Paju-si (KR); Ji-Eun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 416 days.

(21) Appl. No.: 17/973,847

(22) Filed: Oct. 26, 2022

(65) Prior Publication Data
US 2023/0217801 A1 Jul. 6, 2023

(30) Foreign Application Priority Data
Dec. 30, 2021 (KR) .......................... 10-2021-0192484

(51) Int. Cl.
*H10K 77/10* (2023.01)
*H10K 59/121* (2023.01)
*H10K 59/131* (2023.01)
*H10K 102/00* (2023.01)

(52) U.S. Cl.
CPC ....... *H10K 77/111* (2023.02); *H10K 59/1213* (2023.02); *H10K 59/131* (2023.02); *H10K 2102/311* (2023.02)

(58) Field of Classification Search
CPC ............. H10K 77/111; H10K 59/1213; H10K 59/131; H10K 2102/311; H10D 86/60; H10D 86/411; H10D 64/512; H10D 30/673; G09G 2380/02; G09F 9/301; G09F 9/335
See application file for complete search history.

(56) References Cited

U.S. PATENT DOCUMENTS

| | | | | |
|---|---|---|---|---|
| 9,886,063 | B2 * | 2/2018 | Yoo | ........................ G06F 3/0443 |
| 11,864,436 | B2 * | 1/2024 | Ochi | .................... H10K 59/131 |
| 2017/0031389 | A1 * | 2/2017 | Yoo | ........................ G06F 3/0443 |
| 2017/0237027 | A1 * | 8/2017 | Lee | ........................ H10K 59/40 |
| | | | | 257/40 |

FOREIGN PATENT DOCUMENTS

KR 10-2020-0018794 A 2/2020

OTHER PUBLICATIONS

Kim, In June, et al. "Integrated Gate Driver Circuit Technology with Igzo TFT for sensing operation." Journal of the Society for Information Display, vol. 27, No. 5, Apr. 11, 2019, pp. 313-318, https://doi.org/10.1002/jsid.785. (Year: 2019).*
Machine Translation of KR1022458268 (Year: 2020).*

* cited by examiner

*Primary Examiner* — J. E. Schoenholtz
(74) *Attorney, Agent, or Firm* — Fish & Richardson P.C.

(57) ABSTRACT

A display apparatus includes a display panel including a display area and a non-display area, the display panel having a first direction in a long side direction and a second direction in a short side direction, a flat area and a folding area of the non-display area disposed at left and right sides of the display area, and a plurality of first GIP (Gate In Panel) blocks and second GIP blocks disposed in the flat area and the folding area, wherein the size of the second GIP block is larger than that of the first GIP block.

16 Claims, 8 Drawing Sheets

GIP LAYOUT FOR FOLDING DISPLAY

CROSS-REFERENCE TO RELATED APPLICATION

This application claims the priority of Korean Patent Application No. 10-2021-0192484, filed on Dec. 30, 2021, which is hereby incorporated by reference in its entirety.

BACKGROUND

Field of the Disclosure

The present disclosure relates to a display apparatus, and more particularly to a foldable display apparatus having rigidity against compressive stress and tensile stress.

Description of the Background

Recently, the importance of the display apparatus is increasing with the development of multimedia. As such the display apparatus, a flat panel display apparatus such as a liquid crystal display apparatus and an organic light emitting display apparatus has been commercialized. Among the display apparatus, the organic light emitting display apparatus is currently widely used because of its high response speed, high luminance, and good viewing angle.

Meanwhile, the foldable display apparatus has been recently proposed. In the foldable display apparatus, since the compressive stress and the tensile stress are repeatedly applied as the unfolding and folding actions are repeated, there is a problem in that the reliability of the elements of the display apparatus is deteriorated.

SUMMARY

Accordingly, the present disclosure is to provide a display apparatus capable of increasing the area of the GIP block in the folding area while preventing the increase of the bezel area.

A display apparatus according to the present disclosure comprises a display panel including a display area and a non-display area, the display panel having a first direction in a long side direction and a second direction in a short side direction, a flat area and a folding area of the non-display area disposed at left and right sides of the display area, and a plurality of first GIP (Gate In Panel) blocks and second GIP blocks disposed in the flat area and the folding area, wherein the size of the second GIP block is larger than that of the first GIP block.

A length of the second GIP block in the second direction is the same as that of the first GIP block in the second direction, and the length of the second GIP block in the first direction is longer than that of the first GIP block in the first direction.

A plurality of first thin film transistors are disposed in the first GIP block. A plurality of second thin film transistors are disposed in the second GIP block and a length direction of a semiconductor layer of the second thin film transistor is arranged along the first direction. A third thin film transistor is disposed in the second GIP block and the length direction of the semiconductor layer of the third thin film transistor is arranged along the second direction. A plurality of first lines and second lines are respectively disposed in the first GIP block and the second GIP block.

The length of the second thin film transistor in the first direction is longer than that of each of the first thin film transistor and the third thin film transistor. The first thin film transistor and the third thin film transistor have a single gate electrode. The second thin film transistor has double gate electrodes in which two gate electrodes are arranged in the first direction.

The length of the second thin film transistor in the second direction is the same as that of each of the first thin film transistor and the third thin film transistor.

The first line and the second line are extended along the first direction and are arranged in plurality along the second direction and a width of the second line is greater than that of the first line.

The display panel includes an organic light emitting display panel, a liquid crystal display panel, an electrophoretic display panel, a mini light emitting diode (mini LED) display panel, a micro light emitting diode (micro LED) display panel, and a quantum dot display panel.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain various principles.

In the drawings.

DETAILED DESCRIPTION

Figure 1:
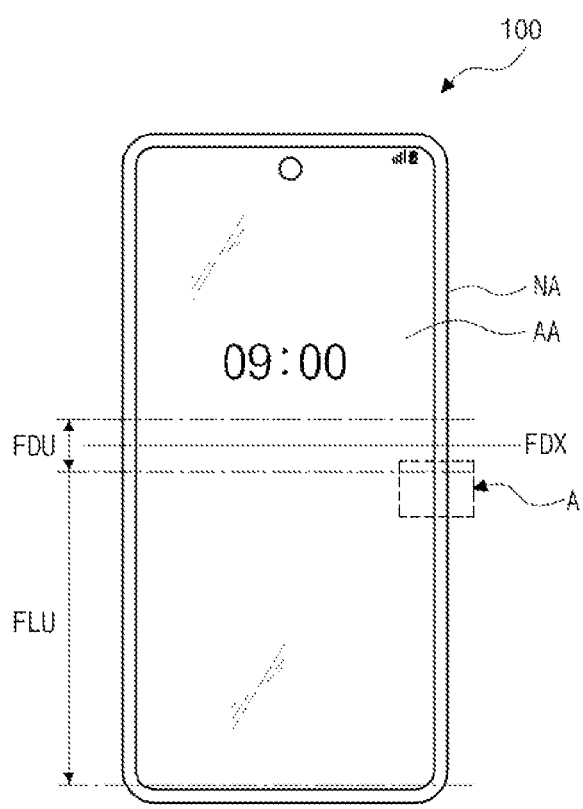
FIG. 1 is a view schematically illustrating the display apparatus according to the present disclosure.

Advantages and features of the present disclosure and methods for achieving them will be made clear from aspects described in detail below with reference to the accompanying drawings. The present disclosure may, however, be implemented in many different forms and should not be construed as being limited to the aspects set forth herein, and the aspects are provided such that this disclosure will be thorough and complete and will fully convey the scope of the present disclosure to those skilled in the art to which the present disclosure pertains, and the present disclosure is defined only by the scope of the appended claims.

Shapes, sizes, ratios, angles, numbers, and the like disclosed in the drawings for describing the aspects of the present disclosure are illustrative, and thus the present disclosure is not limited to the illustrated matters. The same reference numerals refer to the same components throughout this disclosure. Further, in the following description of the present disclosure, when a detailed description of a known related art is determined to unnecessarily obscure the gist of the present disclosure, the detailed description thereof will be omitted herein. When terms such as "including," "having," "comprising," and the like mentioned in this disclosure are used, other parts may be added unless the term "only" is used herein. When a component is expressed as being singular, being plural is included unless otherwise specified.

In analyzing a component, an error range is interpreted as being included even when there is no explicit description.

In describing a positional relationship, for example, when a positional relationship of two parts is described as being "on," "above," "below," "next to," or the like, unless "immediately" or "directly" is used, one or more other parts may be located between the two parts.

In describing a temporal relationship, for example, when a temporal predecessor relationship is described as being "after," "subsequent," "next to," "prior to," or the like, unless "immediately" or "directly" is used, cases that are not continuous may also be included.

Although the terms first, second, and the like are used to describe various components, these components are not substantially limited by these terms. These terms are used only to distinguish one component from another component. Therefore, a first component described below may substantially be a second component within the technical spirit of the present disclosure.

In describing the components of the present specification, terms such as first, second, A, B, (a), (b), etc. may be used. These terms are only for distinguishing the elements from other elements, and the essence, order, or number of the elements are not limited by the terms. When it is described that a component is "connected" or "coupled" to another component, the component may be directly connected or coupled to the other component, but indirectly without specifically stated It should be understood that other components may be "interposed" between each component that is connected or can be connected.

As used herein, the term "apparatus" may include a display apparatus such as a liquid crystal module (LCM) including a display panel and a driving unit for driving the display panel, and an organic light emitting display module (OLED module). Further, the term "apparatus" may further include a notebook computer, a television, a computer monitor, a vehicle electric apparatus including an apparatus for a vehicle (automotive display) or other type of vehicle, and a set electronic apparatus or a set apparatus such as a mobile electronic apparatus of a smartphone or an electronic pad, etc., which are a finished product (complete product or final product) including LCM and OLED module.

Accordingly, the apparatus in the present specification may include the display apparatus itself such as the LCM, the OLED module, etc., and the application product including the LCM, the OLED module, or the like, or the set apparatus, which is the apparatus for end users.

Hereinafter, the present disclosure will be described in detail with reference to the accompanying drawings.

FIG. 1 is a plan view schematically illustrating the display apparatus 100 according to the present disclosure.

As shown in FIG. 1, the display apparatus 100 according to the first aspect of the present disclosure includes a display area AA in which the image is displayed and a non-display area NA formed outside the display area AA.

The display area AA is the area in which the actual image is displayed. A plurality of sub-pixels are arranged in a matrix in the display area AA. A thin film transistor and a display device may be disposed in each of a plurality of sub-pixels.

The display device may include various display devices. The display device may include an organic light emitting display device, a liquid crystal display device, an electrophoretic display device, a mini LED (mini light emitting diode) display device, a micro LED (micro light emitting diode) display device, a quantum dot display device, and the like. The display panel may include an organic light emitting display panel, a liquid crystal display panel, an electrophoretic display panel, a mini light emitting diode (mini LED) display panel, a micro light emitting diode (micro LED) display panel, and a quantum dot display panel.

The non-display area NA is formed outside the display area AA, and various driving devices such as a gate driver and a data driver for applying a signal to the display area AA, and various lines are disposed therein.

The display apparatus 100 is a foldable display apparatus. A folding axis FDX is formed in the foldable display apparatus 100. The folding axis FDX is a center of rotation when the display apparatus 100 is folded. The folding axis FDX is formed in the center of the long side of the display apparatus 100 so that the long side of the display apparatus 100 is folded.

The display apparatus 100 includes a folding area FDU and a flat area FLU. The folding area FDU is a deformation area in which deformation such as bending occurs when the display apparatus 100 rotates about the folding axis FDX. A predetermined area from the center of the folding axis FDX is formed as the folding area FDU. The flat area FLU is an area that does not deform when folded and always maintains a constant shape, and is formed outside the folding area FDU.

In the figure, the folding axis FDX is formed at the center of the long side of the display apparatus 100 to fold the long side of the display apparatus 100, but the folding axis FDX may be formed at the center of the short side to fold the short side of the display apparatus 100.

Figure 2A:
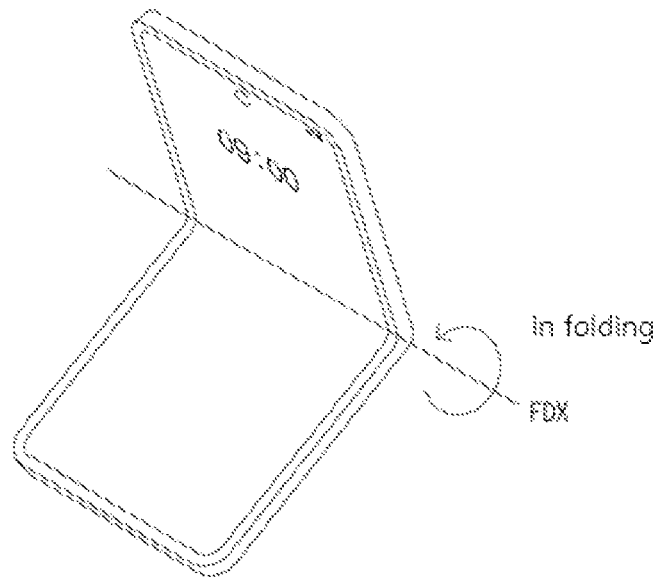
FIGS. 2A and 2B are views illustrating in-folding and out-folding of the display apparatus according to the present disclosure, respectively.
Figure 2B:
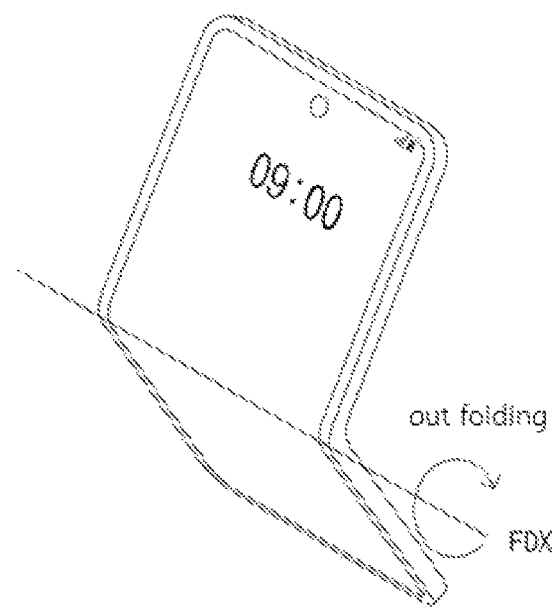

FIGS. 2A and 2B are views respectively illustrating in-folding and out-folding of the display apparatus 100 according to the present disclosure.

As shown in FIG. 2A, when the display apparatus 100 is in-folded toward the screen side on which the image is displayed around the folding axis FDX, a compressive stress is applied to the folding area FDU on the screen side and a tensile stress is applied to the outer folding area FDU which is the opposite side of the screen.

As shown in FIG. 2B, further, when the display apparatus 100 is out folded to the opposite side of the screen on which the image is displayed around the folding axis FDX, a tensile stress is applied to the folding area FDU on the screen side and compressive stress is applied to the outer folding area FDU.

As described above, as the foldable display apparatus 100 is unfolded and folded repeatedly, the compressive stress and the tensile stress is repeatedly applied to the folding area FDU of the display apparatus 100. Accordingly, the continuous stress is applied to the elements of the folding area FDU, for example, thin film transistors or lines, so that the elements may be damaged, or the lifespan may be reduced.

In order to solve this problem, in the present disclosure, various elements formed in the folding area FDU have the different structure or different area from those of the flat area FLU, thereby having resistance to compressive stress or tensile stress.

Hereinafter, various aspects of the present disclosure will be described in detail.

The present disclosure can be applied to various display apparatus. For example, the present disclosure can be applied to the various display apparatus such as an organic light emitting display apparatus, a liquid crystal display apparatus, a quantum dot display apparatus, a mini LED (Light Emitting Diode) display apparatus, and a micro LED display apparatus. However, hereinafter, the organic light emitting display apparatus will be described as an example for convenience of description.

Figure 3:
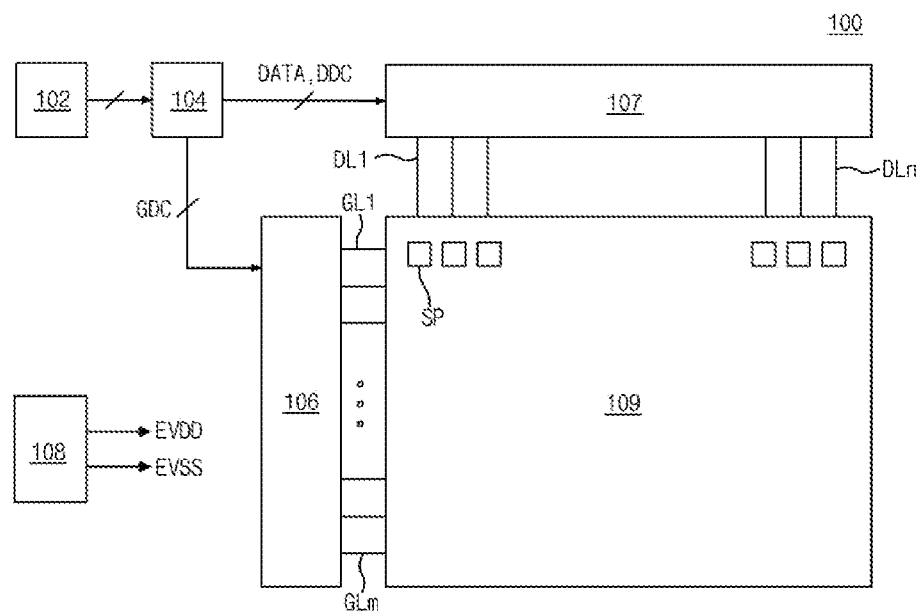
FIG. 3 is a schematic block diagram of a display apparatus according to the present disclosure.

FIG. 3 is the schematic block diagram of the organic light emitting display apparatus according to this disclosure. As shown in FIG. 3, the organic light emitting display apparatus 100 includes an image processing unit 102, a timing controlling unit 104, a gate driving unit 106, a data driving unit 107, a power supplying unit 108, and a display panel 109.

The image processing unit 102 outputs an image data supplied from outside and a driving signal for driving various devices. For example, the driving signal from the image processing unit 102 can include a data enable signal, a vertical synchronizing signal, a horizontal synchronizing signal, and a clock signal.

The image data and the driving signal are supplied to the timing controlling unit 104 from the image processing unit 102. The timing controlling unit 104 writes and outputs gate timing controlling signal GDC for controlling the driving timing of the gate driving unit 106 and data timing controlling signal DDC for controlling the driving timing of the data driving unit 107 based on the driving signal from the image processing unit 102.

The gate driving unit 106 outputs the scan signal to the display panel 109 in response to the gate timing control signal GDC supplied from the timing controlling unit 104. The gate driving unit 106 outputs the scan signal through a plurality of gate lines GL1 to GLm. In this case, the gate driving unit 106 may be formed in the form of an integrated circuit (IC), but is not limited thereto. The gate driving unit 106 may be formed in a gate in panel (GIP) structure by directly stacking thin film transistors on a substrate inside the organic light emitting display apparatus 100. The GIP may include a plurality of circuits such as a shift register and a level shifter.

The data driving unit 107 outputs the data voltage to the display panel 109 in response to the data timing control signal DDC input from the timing controlling unit 104. The data driving unit 107 samples and latches the digital data signal DATA supplied from the timing controlling unit 104 to convert it into the analog data voltage based on the gamma voltage. The data driving unit 107 outputs the data voltage through the plurality of data lines DL1 to DLn. In this case, the data driving unit 107 may be mounted on the upper surface of the display panel 109 in the form of an integrated circuit (IC), but is limited thereto.

The power supplying unit 108 outputs a high potential voltage EVDD and a low potential voltage EVSS etc. to supply these to the display panel 109. The high potential voltage EVDD and the low potential voltage EVSS are supplied to the display panel 109 through the power line. In this time, the voltage from the power supplying unit 108 is applied to the data driving unit 107 or the gate driving unit 106 to drive thereto.

The display panel 109 displays the image based on the data voltage from the data driving unit 107, the scan signal from the gage driving unit 106, and the power from the power supplying unit 108.

The display panel 109 includes a plurality of sub-pixels SP to display the image. The sub-pixel SP can include Red sub-pixel, Green sub-pixel, and Blue sub-pixel. Further, the sub-pixel SP can include White sub-pixel, the Red sub-pixel, the Green sub-pixel, and the Blue sub-pixel. The White sub-pixel, the Red sub-pixel, the Green sub-pixel, and the Blue sub-pixel may be formed in the same area or may be formed in different areas.

Figure 4A:
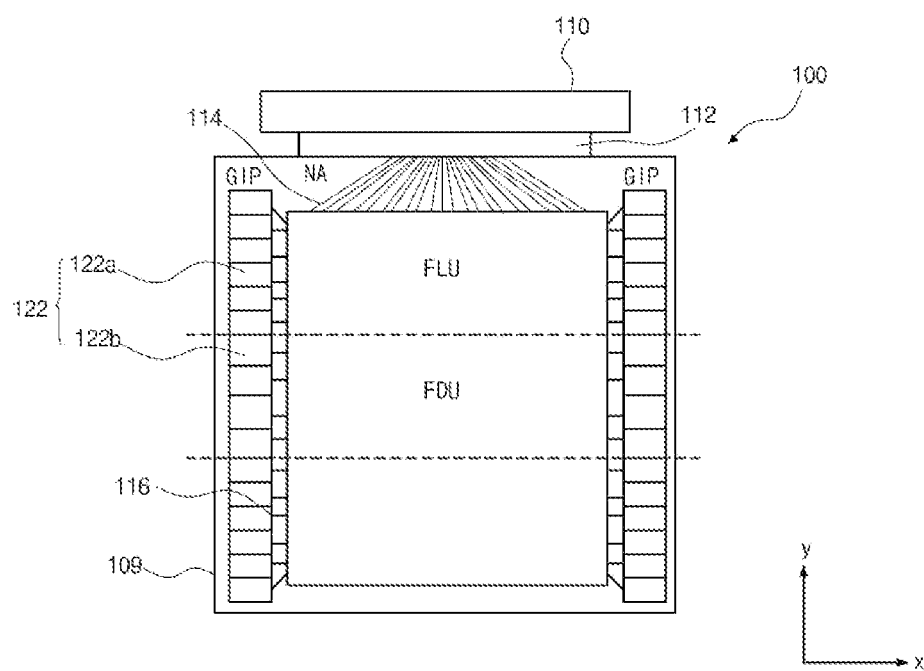
FIGS. 4A and 4B are views schematically illustrating a display area and a GIP area of a non-display area of the organic light emitting display apparatus according to the present disclosure, respectively.
Figure 4B:
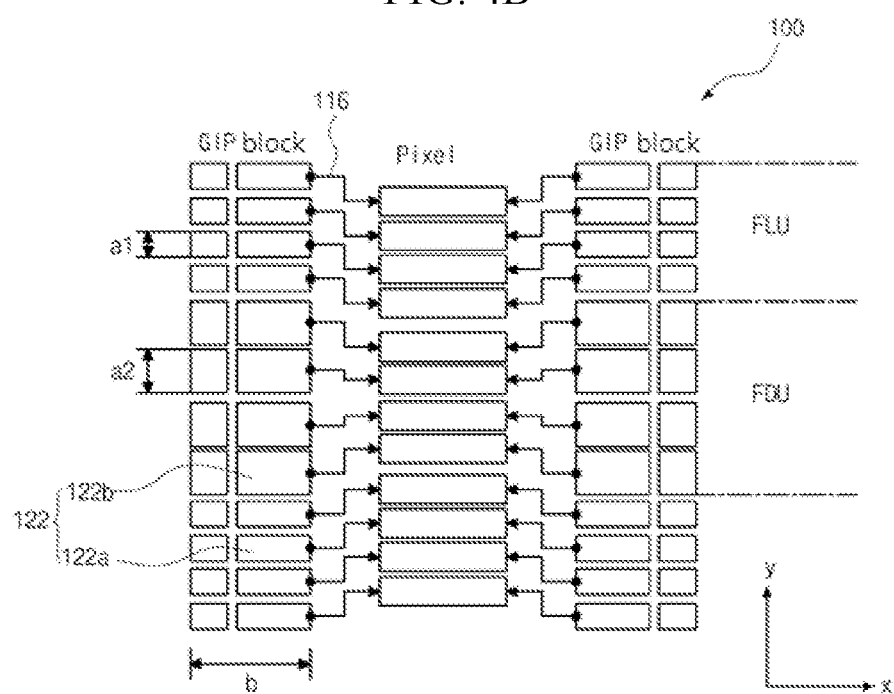

FIGS. 4A and 4B are diagrams schematically illustrating the display area AA and the GIP area of the non-display area NA of the organic light emitting display apparatus 100 according to the present disclosure, respectively.

As shown in FIGS. 4A and 4B, the display panel 109 of the display apparatus 100 according to the present disclosure includes the display area AA and the non-display area NA. A plurality of sub-pixels are arranged in a matrix shape in the display area AA, and a plurality of GIP blocks 122 are arranged in the non-display area NA. In this case, although the GIP blocks 122 is formed in the non-display area NA of both sides of the display area AA in the figure, the GIP block 122 may be formed only in one side of the display area AA.

One end of a flexible printed circuit board 112 is attached to a pad area of the non-display area NA at the top of the display panel 109, and the other end of the flexible printed circuit board 112 is attached to a printed circuit board 110, so that the display panel 109 and the printed circuit board 112 are connected by the flexible printed circuit board 112. The various elements such as the image processing unit, the timing control unit, and the power supply unit may be mounted on the printed circuit board 110, and the data driving unit may be mounted on the flexible printed circuit board 112.

A data link line 114 is formed in the non-display area NA of the upper end of the display panel 109. One end of the data link line 114 is connected to line disposed on the flexible printed circuit board 112 and the other end is connected to the data line of the display area AA, so that the signal from the various elements mounted on the printed circuit board 110 and the signal from the data driving unit mounted on the flexible printed circuit board 112 are supplied to the sub-pixels through the data line.

A plurality of GIP blocks 122 are disposed in the flat area and folding area of the non-display area NA at left and right sides (or one side) of the display area AA. In this case, each GIP block 122 corresponds to each column of the sub-pixel of the display area AA. A plurality of gate link lines 116 are formed in the non-display area NA at both sides (or one side) of the display area AA. One end of the gate link line 116 is connected to the circuit of the GIP block 122 and the other end is connected to the gate line of the display area AA, so that the signal of the GIP block 122 is applied to the sub-pixel through the gate line. The gate link line 116 may connect the GIP block 122 to corresponding sub-pixel columns of the display area AA.

In the organic light emitting display apparatus 100 according to the present disclosure, the GIP block 122a of the flat area FLU and the GIP block 122b of the folding area FDU have different areas, and the reason is as follows.

When the organic light emitting display apparatus 100 is continuously folded and unfolded, the compressive stress and the tensile stress are continuously applied to the folding area FDU. By these stresses, the impact is continuously applied to the various lines and the elements in the folding area FDU, so that the performance of the lines and the elements is deteriorated or the lifetime of the lines and the elements is reduced. In addition, the lines and the elements are damaged by the stresses, so that the reliability of the organic light emitting display apparatus 100 is deteriorated.

In the present disclosure, in order to prevent the decrease in reliability of the organic light emitting display apparatus 100, the area of the GIP block 122b of the folding area FDU, more precisely, the size of the lines and the elements such as the thin film transistor disposed in the GIP block 122b of the folding area FDU is increased, and thus the strength of the lines and the elements may be increased, thereby improving resistance to continuously applied stress.

In the present disclosure, specially, the resistance to the stress is increased by increasing the size of the GIP block 122b of the folding area FDU. In this case, the length b of the GIP block 122b in the x-direction (the short side direction of the display apparatus 100) is not changed (i.e., same as that of the GIP block 122a) and the length a2 of the GIP block 122b in the y-direction (the long side direction of the display apparatus 100) is increased over the length a1 of the GIP block 122a to increase the size of the GIP block 122b in the folding area FDU, thereby improving the strength of the elements and lines and preventing increase of a bezel caused by the increase of the GIP block 122b in the folding area FDU.

Since there is no space on the left and right sides of the display area AA, when the length of the GIP block 122b is increased in the x-direction to increase the size of the GIP block 122b of the folding area FDU, the short side of the display apparatus 100 is increased and thus the bezel area is also increased.

On the other hand, there is the space in the non-display area NA in the y-direction. For example, left and right upper ends of the non-display area NA corresponding to the area to which the flexible printed circuit board 112 is attached are areas in which devices or circuits are not formed. Further, the lower end of the non-display area NA also has the space compared to the left and right sides.

Accordingly, in the present disclosure, the area of the GIP block 122b is increased by increasing the length of the GIP block 122b of the folding area FDU along the y-direction. In the left and right sides of the non-display area NA, the positions of the GIP blocks 122a in the flat area FLU are moved to the upper and lower end portions which have the space margin by the increase of the length in the y-direction of the GIP block 122b, so that the size of the GIP block 122b in the folding area FDU may be increased without increasing the size of the bezel.

As the length of the GIP block 122b of the folding area FDU increases along the y-direction, the GIP blocks 122a and 122b in the non-display area NA of the flat area FLU and the folding area FDU are moved based on the folding axis FDX. At this time, the GIP blocks 122a and 122b move up and down and are disposed outside the upper and lower portions of the display area AA, but the GIP blocks 122a and 122b at the most top and most bottom are disposed in the margin space of the display panel 109. Therefore, the size of the display panel 109 is not varied despite the movement of the GIP blocks 122a and 122b.

The shape of the gate link line 116 is also changed by the movement of the GIP blocks 122a and 122b. For example, since the GIP block 122b disposed in the folding axis FDX is arranged in the same horizontal line as the corresponding sub-pixel column, the gate link line 116 connecting the GIP block 122b and the corresponding sub-pixel column is formed in parallel to the horizontal line (i.e., x-direction).

On the other hand, since the GIP blocks 122a and 122b disposed in the upper and lower portions of the folding axis FDX are not disposed in the same horizontal line as the corresponding sub-pixel column (i.e., not in parallel to the x-direction), the gate link line connecting the GIP block 122b and the corresponding sub-pixel column 116 is formed at a predetermined angle with the horizontal line or is formed with the predetermined step difference.

As the GIP blocks 122a and 122b move from the folding axis FDX to the upper and lower portions of the display panel 109, the separation distance from the corresponding sub-pixel column increases. Thus, the inclination angle or the step difference of the gate link line 116 with respect to the x-direction is increased toward the upper and lower portions of the display panel 109 from the folding axis FDX.

As described above, in the display apparatus 100 according to the present disclosure, the area of the GIP block 122a of the flat area FLU is not changed and the area of the GIP block 122b of the folding area FDU is increased. Accordingly, it is possible to prevent deterioration of reliability of the elements and the lines of the folding area FDU caused by the repeated folding without increasing the size of the bezel.

Figure 5A:
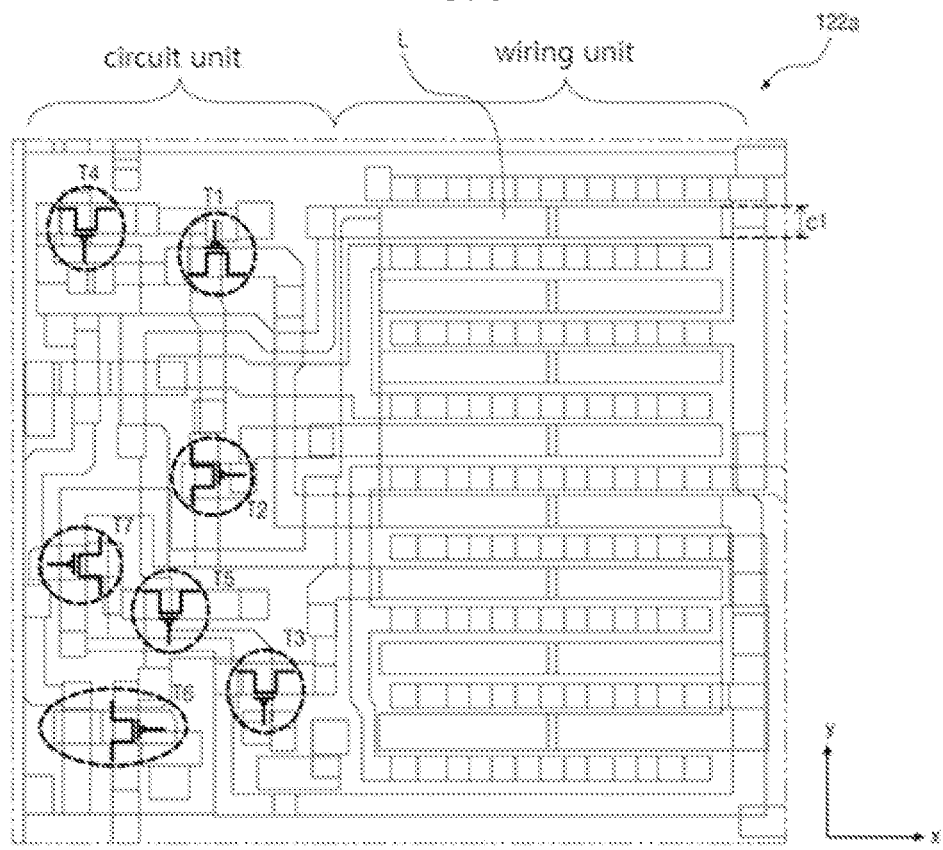
FIGS. 5A and 5B are plan views illustrating a GIP block in a flat area and a GIP block in a folding area, respectively.
Figure 5B:
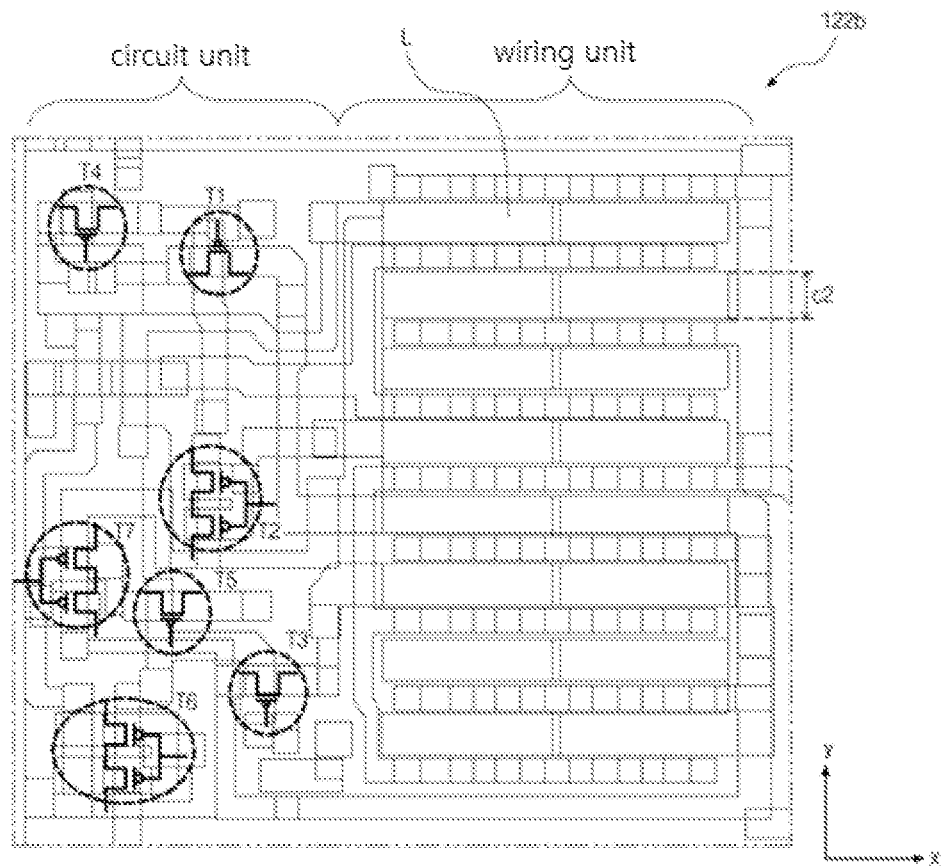

FIGS. 5A and 5B are plan views illustrating the GIP block 122a of the flat area FLU and the GIP block 122b of the folding area FDU, respectively.

As shown in FIGS. 5A and 5B, the GIP blocks 122a and 122b of the display apparatus 100 according to the present disclosure include a wiring unit and a circuit unit.

The wiring unit may include lines for supplying signal pulses, various clock signals, voltage gate high (VGH), voltage gate low (VGL), and reset signals. A plurality of thin film transistors T1-T7 are disposed in the circuit unit to generate scan signal using various signals supplied through the wiring unit, and then supply the scan signal to pixels of the display panel through gate lines.

The plurality of thin film transistors T1-T7 disposed in the circuit unit may constitute a shift register and a level shifter. In the figure, seven thin film transistors T1-T7 are provided in the circuit unit, but not limited thereto. 6 or less or 8 or more thin film transistors may be disposed in the circuit unit.

The circuit unit of each of the GIP blocks 122a and 122b generates a control signal for the sub-pixel of a corresponding column. The plurality of circuit units are arranged in a line in the long side direction of the display panel, that is, in the y-direction, to apply various signals to the sub-pixels of the corresponding column.

The plurality of thin film transistors T1 to T7 may be disposed in the x-direction and the y-direction. In this case, the arrangement direction of the thin film transistors T1-T7 means the longitudinal direction of a semiconductor layer of the thin film transistors T1-T7.

As shown in the figure, the first TFT T1, the third TFT T3, the fourth TFT T4 and fifth TFT T5 are arranged along the x-direction and the second TFT T2, the sixth TFT T6, and seventh TFT T7 are arranged along the y-direction. However, the plurality of thin film transistors T1-T7 may be arranged in various ways.

For example, more thin film transistors than 3 TFTs (that is, the second TFT T2, the sixth TFT T6, and the seventh TFT T7) may be arranged along the y-direction. Even all of the plurality of thin film transistors T1 to T7 may be arranged along the y-direction.

As shown in FIG. 5A, the thin film transistors T1-T7 disposed in the GIP block 122a of the flat area FLU have the same structure. That is, all of the thin film transistors T1-T7 of the GIP block 122a of the flat area FLU are single gate thin film transistors having a single gate electrode.

On the other hand, as shown in FIG. 5B, the thin film transistors T1-T7 disposed in the GIP block 122b of the folding area FDU have different structures according to the arrangement direction. That is, in the GIP block 122b of the folding region FDU, the first TFT T1, the third TFT T3, the fourth TFT T4, and the fifth TFT T5 arranged along the x-direction are the single gate thin film transistor having the single gate electrode, but the second TFT T2, the sixth TFT T6, and the seventh TFT T7 arranged along the y-direction are the double gate thin film transistors having double gate electrodes. The y-direction length of the thin film transistor arranged in the y-direction in the GIP block 122b of the folding region FDU may be longer than that of each of other transistors in the GIP block 122b of the folding region FDU and the transistors in the GIP block 122a of the flat area FLU. The x-direction length of the thin film transistor arranged in the y-direction in the GIP block 122b of the folding region FDU may be the same as that of each of other transistors in the GIP block 122b of the folding region FDU and the transistors in the GIP block 122a of the flat area FLU.

As descried above, the thin film transistors arranged along the x-direction are formed as the single-gate thin film transistor, and the thin film transistors arranged along the y-direction are formed as the double-gate thin film transistor. Therefore, since the length of the GIP block 122b of the folding area FDU is maintained in the x-direction and only the length of the y-direction is increased, the size of the GIP block 122b of the folding area FDU is increased. However, since the length of the folding area FDU in the x-direction does not increase, the rigidity of the GIP block 122b of the folding area FDU can be improved without increasing the size of the bezel.

Figure 6A:
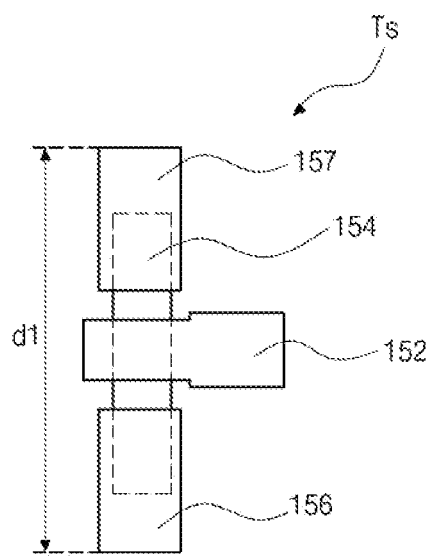
FIGS. 6A and 6B are views illustrating structures of a single gate thin film transistor and a double gate thin film transistor, respectively.
Figure 6B:
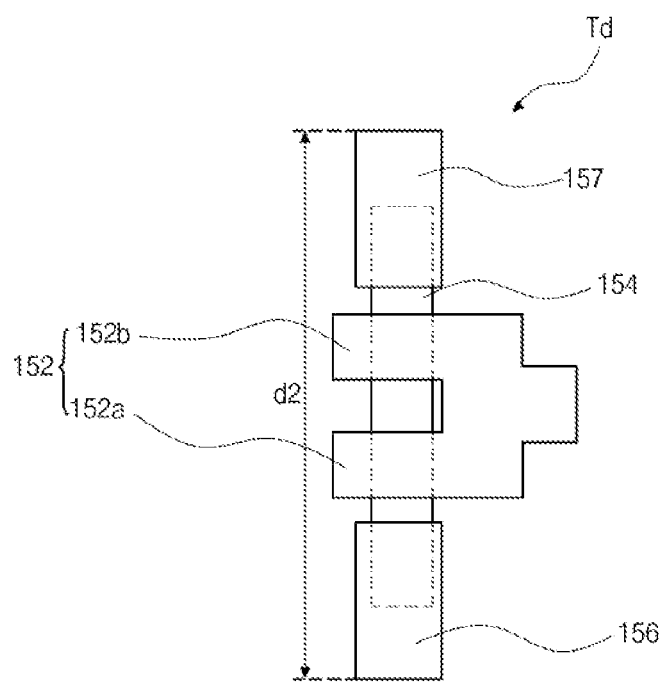

FIG. 6A is the view illustrating the structure of the single gate thin film transistor Ts disposed in the x-direction in the GIP block 122a of the flat area FLU and the GIP block 122b of the folding area FDU, and FIG. 6B is the view illustrating the structure of the double gate thin film transistor Td disposed in the y-direction in the GIP block 122b of the folding area FDU.

As shown in FIGS. 6A and 6B, each of the thin film transistors Ts and Td includes a gate electrode 152, a semiconductor layer 154, a source electrode 156, and a drain electrode 157.

In this case, the single gate thin film transistor Ts shown in FIG. 6A is disposed in the GIP block 122a of the flat area FLU and is disposed in the GIP block 122b of the folding area FDU in the x-direction, and the double gate thin film transistor Td shown in FIG. 6B is disposed in the y-direction in the GIP block 122b of the folding area FDU.

The single gate thin film transistor Ts includes one gate electrode 152, whereas the double gate thin film transistor Td includes two gate electrodes 152a and 152b arranged along the y-direction. Accordingly, the length of the thin film transistor Td in the y-direction is increased by the distance between the two gate electrodes 152a and 152b and the width of the gate electrode 152b (d2>d1). As the length of the thin film transistor Td in the y-direction is increased, the size of the GIP block 122b of the folding area FDU is increased. Thus, the rigidity of the GIP block 122b of the folding area FDU increases so that the defects caused by repeatedly applied stress can be prevented.

Further, since the double gate thin film transistor Td includes two gate electrodes 152a and 152b, the junction between the source electrode 156 and the drain electrode 157 is increased. Accordingly, since the intensity of the electric field applied to the junction is weakened, the leakage current may be reduced.

On the other hand, a plurality of lines L are disposed in the wiring unit of the GIP blocks 122a and 122b. Each of the lines L are extended along the x-direction and a plurality of lines L are disposed along the y-direction. The line L is connected to the plurality of thin film transistors T1-T7 in the circuit unit to apply the various signals such as a signal pulse, various clock signals, a voltage gate high (VGH), a voltage gate low (VGL), and a reset signal to a plurality of thin film transistors T1-T7.

As shown in FIGS. 5A and 5B, since the y-direction length of the GIP block 122b in the folding area FDU is greater than the y-direction length of the GIP block 122a in the flat area FLU, the width c2 of line L disposed in the GIP block 122b of the folding area FDU is greater than the width c1 of the line L disposed in the GIP block 122a of the flat area FLU (c2>c1). Therefore, since the area of the line L disposed in the GIP block 122b of the folding area FDU is greater than that of the line L disposed in the GIP block 122a of the flat area FLU, the disconnection of the line caused by the stress repeatedly applied to the folding area FDU can be prevented.

As described above, in the display apparatus 100 according to the present disclosure, the length of the GIP block 122b in the folding area FDU is increased along the long side direction of the display apparatus 100 so that the size of the GIP block 122b in the folding area FDU is increased. Accordingly, since the strength of the GIP block 122b in the folding area FDU is improved without increasing the bezel size, the defect due to the stress continuously applied by repeated folding can be prevented.

Figure 7:
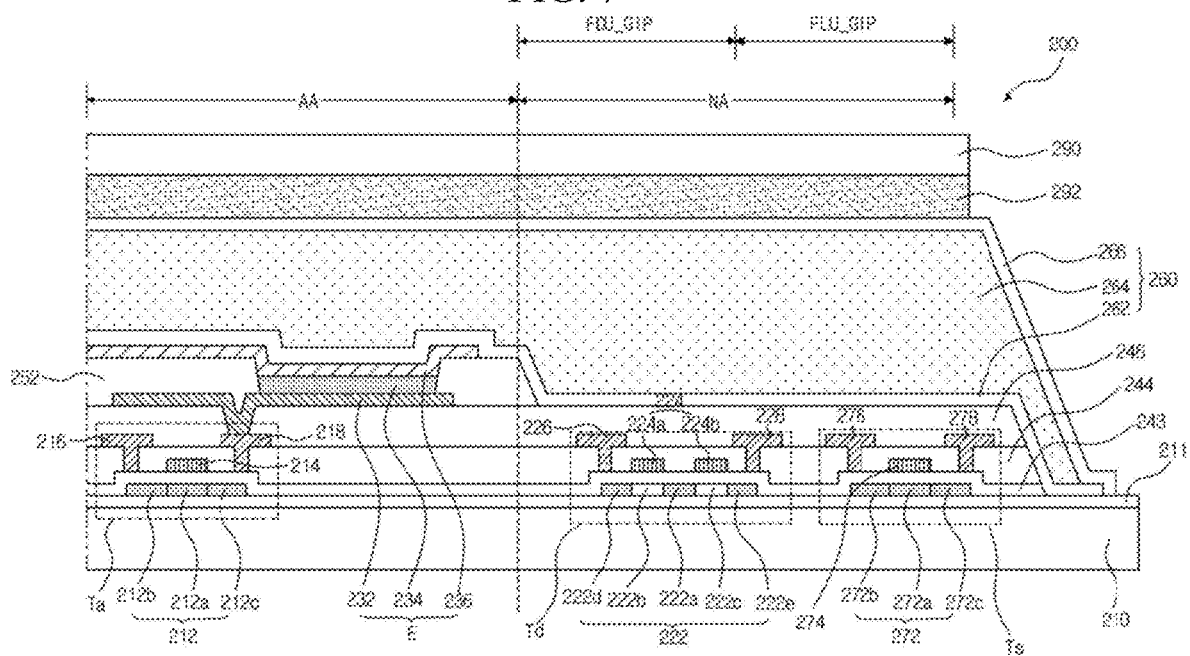
FIG. 7 is a cross-sectional view illustrating the structure of the display apparatus according to the present disclosure.

FIG. 7 is the cross-sectional view illustrating the structure of the display apparatus 200 according to the present disclosure. In this case, the display apparatus 200 of the present disclosure can be applied to various display apparatus. However, hereinafter, the organic light emitting display apparatus 200 will be described as an example for convenience of description.

As shown in FIG. 7, the organic light emitting display apparatus 200 according to the present disclosure includes the display area AA in which an image is displayed and the non-display area NA having GIP block FDU GIP of the folding area and the GIP block FLU GIP of the flat area.

At this time, the double gate thin film transistor Td arranged along the y-direction of the folding area is disposed in the GIP block FDU GIP of the folding area, and the single gate thin film transistor Ts is disposed in the GIP block FLU GIP of the flat area. Although not shown in the figure, the single gate thin film transistor disposed along the x-direction in the GIP block FDU GIP of the folding area has the same structure as the thin film transistor Ts disposed in the GIP block FLU GIP of the flat area.

A buffer layer 211 is formed on the substrate 210. The thin film transistors Ta, Td, and Ts are respectively formed in the display area AA, the GIP block FDU GIP in the folding area, and the GIP block FLU GIP in the flat area on the buffer layer 211.

The first substrate 210 may be made of a foldable plastic material. For example, the first substrate 210 may include at least one of polyimide (PI), polyethylene terephthalate (PET), polyethylene naphthalate (PEN), polycarbonate (PC), polyethersulfone (PES), polyarylate (PAR), polysulfone (PSF), and cyclic-olefin copolymer (COC). However, the first substrate 210 of the present disclosure is not limited to such these plastic materials, but may be formed of the transparent materials such as a foldable thin glass or a rigid glass.

The buffer layer 211 protects the thin film transistor formed in a subsequent process from impurities such as alkali ions leaking from the first substrate 210 or blocks moisture from the outside. The buffer layer 211 may be a single layer made of silicon oxide (SiOx) or silicon nitride (SiNx), or multi-layers thereof, and is not limited thereto.

The thin film transistor Ta in the display area AA includes a semiconductor layer 212 disposed on the buffer layer 211, a gate insulating layer 243 on the buffer layer 211 to cover the semiconductor layer 212, a gate electrode 214 on the gate insulating layer 243, an interlayer insulating layer 244 on the gate insulating layer 243 to cover the gate electrode 214, and a source electrode 216 and a drain electrode 218 on the interlayer insulating layer 244.

The semiconductor layer 212 may be formed of an amorphous semiconductor such as amorphous silicon (a-Si), a crystalline semiconductor such as polycrystalline silicon (p-Si), or an oxide semiconductor such as indium gallium zinc oxide (IGZO), but not limited thereto. The semiconductor layer 212 includes a channel region 212a in the central portion, and a source region 212b and a drain region 212c, which are doping layers, in both sides of the channel region 212a.

The gate electrode 214 may be formed of the single layer or the multi layers made of a metal such as Cr, Mo, Ta, Cu, Ti, Al, or an Al alloy, but is not limited thereto. The gate insulating layer 243 may be formed of a single layer made of an inorganic material such as SiOx or SiNx, or double inorganic layers including SiOx and SiNx, but is not limited thereto.

The interlayer insulating layer 244 may be formed of the organic material such as photoacrylic, a single layer formed of the inorganic material such as SiNx or SiOx, or a plurality of layers thereof. Further, the interlayer insulating layer 244 may be formed of a plurality of layers of the organic material layer and the inorganic material layer.

The source electrode 216 and the drain electrode 218 may be formed of the single layer or a plurality of layers made of the metal such as Cr, Mo, Ta, Cu, Ti, Al, or an Al alloy, but is not limited thereto.

The source electrode 216 and the drain electrode 218 are respectively ohmic contacted to the source region 212b and the drain region 212c of the semiconductor layer 212 through contact holes formed in the gate insulating layer 243 and the interlayer insulating layer 244.

The thin film transistor Td in the GIP block FDU GIP of the folding area FDU includes the semiconductor layer 222 disposed on the buffer layer 211, the gate insulating layer 243 on the buffer layer 211 to cover the semiconductor layer 222, the gate electrode 224 on the gate insulating layer 243, the interlayer insulating layer 244 on the gate insulating layer 243 to cover the gate electrode 224, and the source electrode 226 and the drain electrode 228 on the interlayer insulating layer 244.

The semiconductor layer 222 includes two channel regions 222b and 222c in the central portion, a low concentration doping region 222a between two channel regions 222b and 222c, the source region 222d and the drain region 222e in both sides of the channel regions 222b and 222c.

The gate electrode 224 includes the first gate electrode 224a and the second gate electrode 224b formed on the gate insulating layer 243 at positions corresponding to the channel regions 222b and 222c. Although not shown in the figure, the first gate electrode 224a and the second gate electrode 224b are electrically connected.

The thin film transistor Ts in the GIP block FLU GIP of the flat area FLU includes the semiconductor layer 272 disposed on the buffer layer 211, the gate insulating layer 243 on the buffer layer 211 to cover the semiconductor layer 272, the gate electrode 274 on the gate insulating layer 243, the interlayer insulating layer 244 on the gate insulating layer 243 to cover the gate electrode 274, and the source electrode 276 and the drain electrode 278 on the interlayer insulating layer 244.

The semiconductor layer 272 may include the channel region 272a in a central portion and the source region 272b and the drain region 272c, which are doped layers in both sides.

A passivation layer 246 is formed over the first substrate 210 on which the thin film transistors Ta, Td, and Ts are disposed. The passivation layer 246 may be formed of the organic material such as photo acrylic, but is not limited thereto, and may include a plurality of layers including the inorganic layer and the organic layer.

A first electrode 232 is formed on the passivation layer 246. The first electrode 232 is connected to the drain electrode 218 of the thin film transistor Ta in the display area AA to receive the image signal from the outside. The first electrode 232 may be formed of the single layer or the multi layers made of the metal such as Ca, Ba, Mg, Al, and Ag or an alloy thereof. Further, the first electrode 232 may be formed of the transparent metal oxide such as indium tin oxide (ITO) or indium zinc oxide (IZO).

A bank layer 252 is formed on the passivation layer 246 at the boundary of each sub-pixel of the display area AA. The bank layer 252 may be a type of barrier wall defining a sub-pixel. The bank layer 252 may partition each sub-pixel to prevent the light of a specific color output from a specific sub-pixel from being mixed with the light output from an adjacent sub-pixel.

A light emitting layer 234 is formed on the first electrode 232. The light emitting layer 234 may be formed in the R, G, and B sub-pixels. The light emitting layer 234 may include an B-light emitting layer for emitting red light, a G-light emitting layer for emitting green light, or a B-light emitting layer for emitting blue light. Further, the light emitting layer 234 may include W-light emitting layer for emitting white light. The light emitting layer 234 may be an organic light emitting layer, but is not limited thereto. For example, the light emitting layer 234 may be an inorganic light emitting layer, a quantum dot light emitting layer, or a micro-LED.

The light emitting layer 234 may include an electron injecting layer and a hole injecting layer for respectively injecting electrons and holes into the light emitting layer, and an electron transporting layer, a hole blocking layer, an electron blocking layer, and a hole transporting layer for respectively transporting the injected electrons and holes to the light emitting layer.

A second electrode 236 may be formed on the light emitting layer 234 in the entire display apparatus 200. The second electrode 236 may be made of the transparent conductive material such as ITO or IZO, or a thin metal through which visible light is transmitted, but is not limited thereto. In addition, the second electrode 236 may be formed of the single layer or the multi layers made of the metal such as Ca, Ba, Mg, Al, and Ag or an alloy thereof.

The first electrode 232, the light emitting layer 234, and the second electrode 236 form the light emitting device E to output light having a specific wavelength as the signal is applied from the outside.

An encapsulation layer 260 is formed over the light emitting device E and the bank layer 252. The encapsulation layer 236 includes a first encapsulation layer 262 made of the inorganic material, a second encapsulation layer 264 made of the organic material, and a third encapsulation layer 266 made of the inorganic material. The inorganic material may include SiNx and SiOx, but is not limited thereto. The organic material may include polyethylene terephthalate, polyethylene naphthalate, polycarbonate, polyimide, polyethylene sulfonate, polyoxymethylene, polyarylate, or mixtures thereof, but is not limited thereto.

Although not shown in the figure, a color filter layer may be formed on the third encapsulation layer 266. In this case, the color filter layer may include R, G, and B color filters formed in each sub-pixel.

The color filter layer transmits only the light of a corresponding wavelength among the light emitted from the light emitting device E and absorbs the light of other wavelengths to display R, G, and B colors. When the light emitting layer 234 of the light emitting device E emits white light, R, G, and B colors may be displayed by the color filter layer.

In addition, when the light emitting layer 234 of the light emitting device E emits monochromatic light, for example, the light of R, G, and B colors, the R, G, and B color filter layers may be respectively formed in sub-pixels of corresponding colors. For example, the R color filter layer may be disposed on the sub-pixel for emitting red light, the G color filter layer may be disposed on the sub-pixel for emitting green light, and the B color filter layer may be disposed on the sub-pixel for emitting blue light. The color filter layer filters the light of the corresponding color and outputs the input light as light having a higher purity color.

The encapsulation layer 260 is extended to the non-display area NA to cover the thin film transistors Td and Ts in the non-display area NA.

An adhesive 292 is disposed on the third encapsulation layer 266 and a protection member 290 is disposed thereon. The protection member 290 is attached to the third encapsulation layer 266 by the adhesive 292.

The protective member 290 protects and encapsulates the organic light emitting display apparatus 200. The protective member 290 may be made of glass or a transparent film. The transparent film may be a transparent protective film such as a polystyrene (PS) film, a polyethylene (PE) film, a polyethylene naphthalate (PEN) film, or a polyimide (PI) film.

A transparent optical adhesive (OCA) may be used as the adhesive 292, but is not limited thereto, and various adhesive may be used.

The features, structures, effects, etc. described in the example of the application are included in at least one example of the application, and are not necessarily limited to one example. Furthermore, the features, structure, effects, etc. exemplified in at least one example of the application can be combined or modified with other examples by a person having general knowledge of the field to which the application belongs. Therefore, the contents related to these combinations and modifications should be interpreted as being included in the scope of the application.

The present application described above is not limited to the above-described aspect and the accompanying drawings. It will be apparent to those skilled in the art that various substitutions, modifications and changes are possible without departing from the technical matters of the present application. Therefore, the scope of the present application is indicated by the following claims, and all changes or modifications derived from the meaning and scope of the claims and their equivalent concepts should be construed as being included in the scope of the present application.

What is claimed is:

1. A display apparatus, comprising:
   a display panel including a display area and a non-display area, the display panel having a first direction in a long side direction and a second direction in a short side direction;
   a flat area and a folding area in the non-display area disposed at left and right sides of the display area; and
   a plurality of first Gate In Panel (GIP) blocks and second GIP blocks disposed in the flat area and the folding area,
   wherein a size of the second GIP block is larger than that of the first GIP block.

2. The display apparatus of claim 1, wherein a length of the second GIP block in the second direction is the same as that of the first GIP block in the second direction, and a length of the second GIP block in the first direction is longer than that of the first GIP block in the first direction.

3. The display apparatus of claim 2, further comprising:
   a plurality of first thin film transistors disposed in the first GIP block;
   a plurality of second thin film transistors disposed in the second GIP block, a length direction of a semiconductor layer of the second thin film transistor being arranged along the first direction;
   a third thin film transistor disposed in the second GIP block, a length direction of the semiconductor layer of the third thin film transistor being arranged along the second direction;
   a plurality of first lines disposed in the first GIP block; and
   a plurality of second lines disposed in the second GIP block.

4. The display apparatus of claim 3, wherein a length of the second thin film transistor in the first direction is longer than that of each of the first thin film transistor and the third thin film transistor.

5. The display apparatus of claim 4, wherein the plurality of first thin film transistors and the third thin film transistor have a single gate electrode.

6. The display apparatus of claim 4, wherein the plurality of second thin film transistors has double gate electrodes in which two gate electrodes are arranged in the first direction.

7. The display apparatus of claim 3, wherein a length of the second thin film transistor in the second direction is the same as the plurality of first thin film transistors and the third thin film transistor.

8. The display apparatus of claim 3, wherein the plurality of first lines and the plurality of second lines are extended along the first direction and are arranged along the second direction.

9. The display apparatus of claim 8, wherein a width of each of the plurality of second lines is greater than that of the plurality of first lines.

10. The display apparatus of claim 1, further comprising a gate link line disposed in the non-display area to connect the first GIP block and the second GIP block to corresponding sub-pixel columns of the display area.

11. The display apparatus of claim 1, wherein the display panel includes an organic light emitting display panel, a liquid crystal display panel, an electrophoretic display panel, a mini light emitting diode (mini LED) display panel, a micro light emitting diode (micro LED) display panel, and a quantum dot display panel.

12. The display apparatus of claim 10, wherein the gate link line connecting the GIP block disposed in a folding axis and the corresponding sub-pixel column is formed in parallel to the second direction,
   wherein the gate link line connecting the GIP block disposed in upper and lower portions of the folding axis and the corresponding sub-pixel column is not formed in parallel to the second direction, and
   wherein the folding axis is a center of rotation when the display apparatus is folded.

13. The display apparatus of claim 12, wherein an inclination angle of the gate link line with respect to the second direction is increased toward upper and lower portions of the display panel from the folding axis.

14. The display apparatus of claim 3, wherein an area of each of the plurality of second lines is greater than that of each of the plurality of first lines.

15. The display apparatus of claim 1, wherein an area of the second GIP block is larger than that of the first GIP block.

16. The display apparatus of claim 1, wherein each of the first GIP blocks and the second GIP blocks includes:
- a circuit unit generating a control signal for a corresponding sub-pixel column of the display area; and
- a plurality of circuit units arranged in a line in the second direction.

\* \* \* \* \*